United States Patent
Sawada et al.

(10) Patent No.: US 10,791,624 B2
(45) Date of Patent: *Sep. 29, 2020

(54) RESIN COMPOSITION AND FILM USING SAME

(71) Applicant: PANASONIC INTELLECTUAL PROPERTY MANAGEMENT CO., LTD., Osaka (JP)

(72) Inventors: Tomoaki Sawada, Osaka (JP); Takatoshi Abe, Osaka (JP); Shingo Yoshioka, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/980,245

(22) Filed: May 15, 2018

(65) Prior Publication Data

US 2018/0263113 A1 Sep. 13, 2018

Related U.S. Application Data

(62) Division of application No. 14/405,541, filed as application No. PCT/JP2014/001304 on Mar. 7, 2014, now Pat. No. 10,009,994.

(30) Foreign Application Priority Data

Oct. 10, 2013 (JP) ................................ 2013-212790

(51) Int. Cl.
  *H05K 1/02* (2006.01)
  *C08J 5/18* (2006.01)
  (Continued)

(52) U.S. Cl.
  CPC ............. *H05K 1/0271* (2013.01); *B32B 5/02* (2013.01); *C08J 5/18* (2013.01); *C08J 7/0427* (2020.01);
  (Continued)

(58) Field of Classification Search
  CPC .................................................... H05K 1/0271
  See application file for complete search history.

(56) References Cited

U.S. PATENT DOCUMENTS 3,357,954 A 12/1967 Kirkaldy
4,222,913 A 9/1980 Cooper
(Continued)

FOREIGN PATENT DOCUMENTS

CN 103224711 7/2013
EP 0560380 9/1993
(Continued)

OTHER PUBLICATIONS

Wang, Xiao-Shui et al., "Relaxation and reinforcing effects of polyrotaxane in an epoxy resin matrix," Macromolecules 39.3 (2006): pp. 1046-1052.

(Continued)

*Primary Examiner* — Megan McCulley
(74) *Attorney, Agent, or Firm* — Greenblum & Bernstein, P.L.C.

(57) ABSTRACT

The present invention is a resin composition characterized by being able to undergo elastic deformation, having little residual strain rate and exhibiting stress relaxation properties. More specifically, the present invention relates to a resin composition wherein the stress relaxation rate (R) and the residual strain rate (α), as measured in a prescribed extension-restoration test, are as follows: $20\% \leq R \leq 95\%$ and $0\% \leq \alpha \leq 3\%$.

9 Claims, 2 Drawing Sheets

(51) Int. Cl.

| | | |
|---|---|---|
| *C08K 7/02* | (2006.01) | |
| *C08L 101/00* | (2006.01) | |
| *C09D 105/16* | (2006.01) | |
| *C08J 7/04* | (2020.01) | |
| *G06F 3/041* | (2006.01) | |
| *H01B 1/02* | (2006.01) | |
| *H01L 31/0224* | (2006.01) | |
| *H05K 1/03* | (2006.01) | |
| *B32B 5/02* | (2006.01) | |
| *H01B 1/24* | (2006.01) | |
| *C09D 163/00* | (2006.01) | |
| *B32B 15/092* | (2006.01) | |
| *B32B 15/08* | (2006.01) | |
| *B32B 3/12* | (2006.01) | |
| *B32B 3/26* | (2006.01) | |

(52) U.S. Cl.
CPC .............. *C08K 7/02* (2013.01); *C08L 101/00* (2013.01); *C09D 105/16* (2013.01); *C09D 163/00* (2013.01); *G06F 3/041* (2013.01); *H01B 1/02* (2013.01); *H01B 1/24* (2013.01); *H01L 31/022466* (2013.01); *H01L 31/022491* (2013.01); *H05K 1/028* (2013.01); *H05K 1/0213* (2013.01); *H05K 1/0274* (2013.01); *H05K 1/0296* (2013.01); *H05K 1/0326* (2013.01); *H05K 1/0333* (2013.01); *H05K 1/0366* (2013.01); *B32B 3/12* (2013.01); *B32B 3/266* (2013.01); *B32B 15/08* (2013.01); *B32B 15/092* (2013.01); *B32B 2260/021* (2013.01); *B32B 2260/046* (2013.01); *B32B 2262/103* (2013.01); *B32B 2262/106* (2013.01); *B32B 2262/14* (2013.01); *B32B 2307/202* (2013.01); *B32B 2307/412* (2013.01); *B32B 2307/50* (2013.01); *B32B 2363/00* (2013.01); *C08J 2300/21* (2013.01); *C08J 2367/02* (2013.01); *C08J 2400/21* (2013.01); *C08J 2463/00* (2013.01); *H05K 2201/012* (2013.01); *H05K 2201/0108* (2013.01); *H05K 2201/0323* (2013.01); *H05K 2201/0326* (2013.01); *Y10T 428/24331* (2015.01); *Y10T 428/24917* (2015.01)

(56) References Cited

U.S. PATENT DOCUMENTS

| | | | |
|---|---|---|---|
| 7,626,128 | B2 | 12/2009 | Yasushi et al. |
| 9,802,397 | B2* | 10/2017 | Abe .................... B32B 27/36 |
| 2003/0138398 | A1 | 7/2003 | Okumura et al. |
| 2005/0215963 | A1 | 9/2005 | Autran |
| 2008/0097039 | A1 | 4/2008 | Ito et al. |
| 2008/0143906 | A1 | 6/2008 | Allemand et al. |
| 2009/0079322 | A1 | 3/2009 | Tsutsumi et al. |
| 2009/0088546 | A1 | 4/2009 | Ito et al. |
| 2010/0129677 | A1 | 5/2010 | Ito et al. |
| 2010/0247810 | A1 | 9/2010 | Yukinobu et al. |
| 2010/0252184 | A1 | 10/2010 | Morimoto et al. |
| 2011/0088770 | A1 | 4/2011 | Allemand et al. |
| 2011/0105688 | A1* | 5/2011 | Ruslim ............... C08B 37/0015 525/54.26 |
| 2011/0281070 | A1 | 11/2011 | Mittal et al. |
| 2011/0291058 | A1 | 12/2011 | Yousuke et al. |
| 2012/0220728 | A1 | 8/2012 | Uekusa et al. |
| 2013/0057138 | A1 | 3/2013 | Tsutsumi et al. |
| 2014/0377579 | A1 | 12/2014 | Zhifeng et al. |
| 2015/0034925 | A1 | 2/2015 | Shinotsuka et al. |
| 2015/0166779 | A1 | 6/2015 | Diehl |
| 2015/0373838 | A1 | 12/2015 | Sawada et al. |
| 2016/0122605 | A1 | 5/2016 | Hayashi |
| 2017/0179426 | A1 | 6/2017 | Yamoto et al. |

FOREIGN PATENT DOCUMENTS

| | | |
|---|---|---|
| EP | 2 497 789 | 9/2012 |
| JP | 2001-181561 | 7/2001 |
| JP | 2002-339205 | 11/2002 |
| JP | 2003-113561 | 4/2003 |
| JP | 2005-154675 | 6/2005 |
| JP | 2005-225961 | 8/2005 |
| JP | 2006-127928 | 5/2006 |
| JP | 2006-316089 | 11/2006 |
| JP | 2009-76361 | 4/2009 |
| JP | 2009-163959 | 7/2009 |
| JP | 2010-507199 | 3/2010 |
| JP | 4482633 | 6/2010 |
| JP | 2011-107538 | 6/2011 |
| JP | 2011-140555 | 7/2011 |
| JP | 2012-27488 | 2/2012 |
| JP | 2012-63437 | 3/2012 |
| JP | 2013-124298 | 6/2013 |
| JP | 2014-034622 | 2/2014 |
| WO | 2001/83566 | 11/2001 |
| WO | 2009/057637 | 5/2009 |
| WO | 2013/125235 | 8/2013 |
| WO | 2014/196636 | 12/2014 |

OTHER PUBLICATIONS

International Search Report for Patent Application No. PCT/JP2014/001304, dated Jul. 8, 2014.

International search report issued with respect to Application No. PCT/JP2014/005132, dated Jan. 23, 2015.

U.S. Office Action issued with respect to U.S. Appl. No. 14/405,572, dated Feb. 1, 2016.

Office Action issued in counterpart U.S. Appl. No. 14/405,533, dated Sep. 2, 2016.

\* cited by examiner

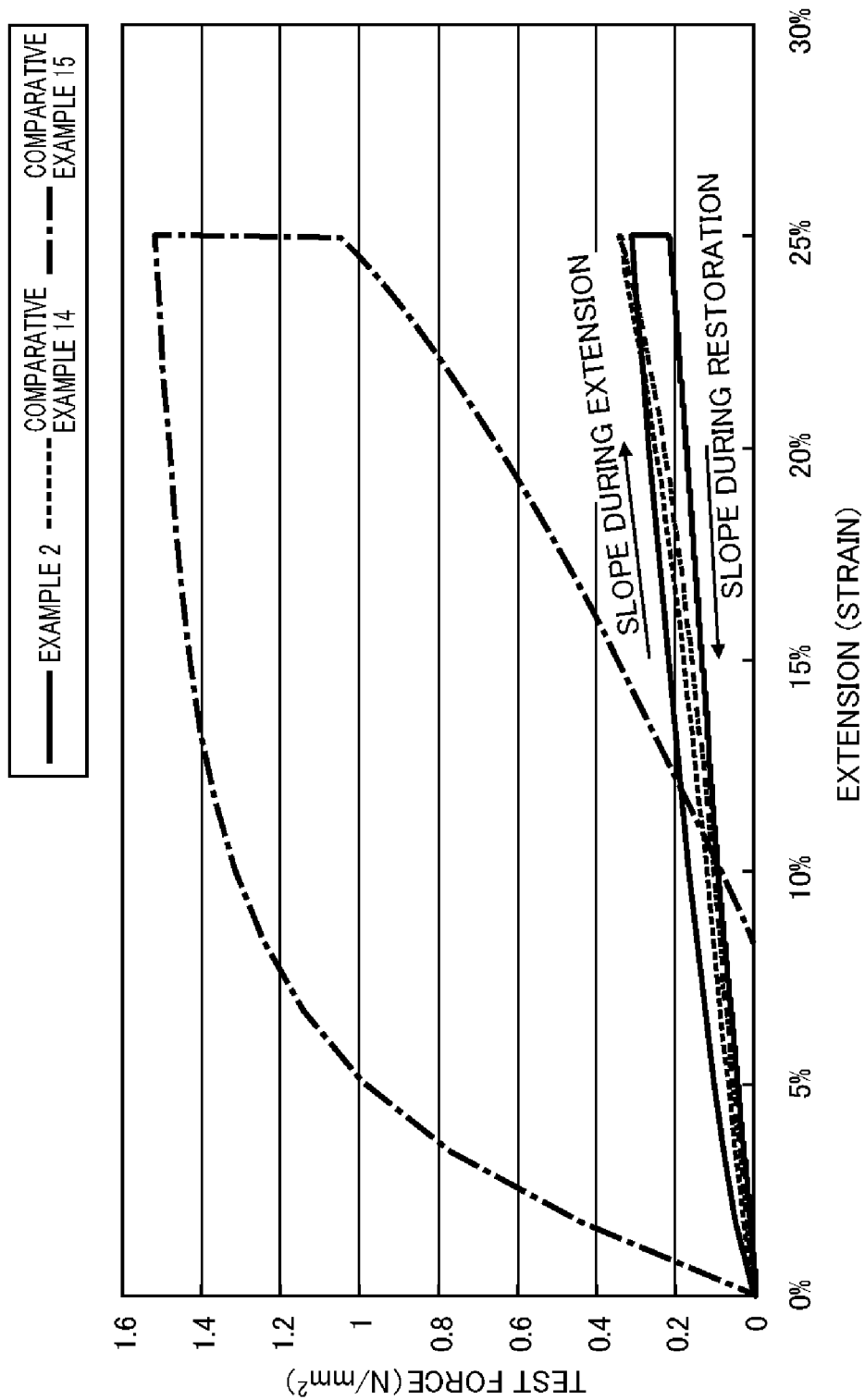
[Fig. 1]

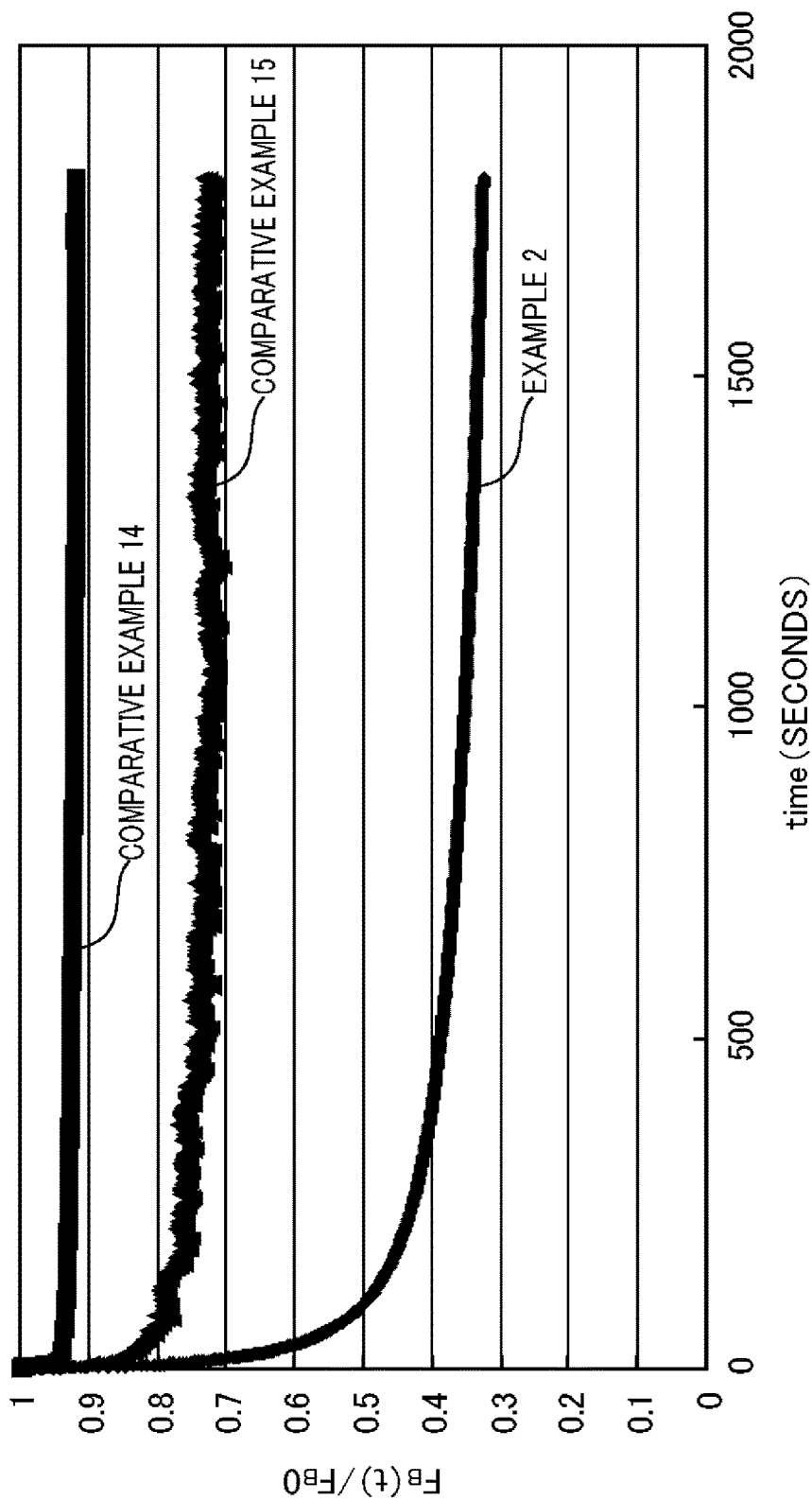
[Fig. 2]

RESIN COMPOSITION AND FILM USING SAME

The present application is a Divisional Application of U.S. application Ser. No. 14/405,541, filed on Dec. 4, 2014, which is a U.S. National Stage Application of International Patent Application No. PCT/JP2014/001304 filed on Mar. 7, 2014, which claims priority to Japanese Application No. 2013-212790 filed on Oct. 10, 2013. The disclosures of U.S. application Ser. No. 14/405,541 and International Patent Application No. PCT/JP2014/001304 are incorporated by reference herein in their entireties.

TECHNICAL FIELD

The present invention relates to a resin composition having high tensile stress relaxation properties and excellent recoverability following extension, and also to a film that uses this resin composition.

BACKGROUND ART

Thermosetting resins are used in a wide variety of fields, such as electronic materials and optical materials, due to exhibiting excellent heat resistance, chemical resistance, moldability, insulation reliability, and so on. In particular, epoxy resins, which are thermosetting resins, are often used in a variety of applications, but epoxy resins are excellent in terms of the characteristics mentioned above, but are known to be generally hard and poor in terms of flexibility. As a result, epoxy resins can deform or break when subjected to external stress or thermal stress.

Examples of materials that exhibit superior flexibility include silicone resins, urethane resins, thermoplastic resins such as polyethylene, and a variety of rubber materials. Moreover, the flexibility of resin materials requires not only a low elastic modulus and a high tensile elongation, but also requires recoverability following extension when used in a variety of components.

For example, there is ongoing development of flexible display devices, such as electronic paper, which use materials having excellent flexibility. In general, electronic paper uses a system such as an electrophoretic system or a twisting ball system, but these systems are constituted from a laminate consisting of a display layer for realizing a display and an electrically conductive layer for applying a voltage. Electrophoretic flexible display devices use mainly urethane resins (see Patent Document 1). Meanwhile, twisting ball type flexible display devices use silicone resins (see Patent Document 2).

In addition to flexibility, meanwhile, stress relaxation properties are a characteristic that has come to be required of resin materials in recent years. The matter that residual stress increases when an article is deformed as a result of stress being applied means that the force required to return the article to its original shape is large, and this means that if the residual stress is large, detachment and breakage can occur between components. Therefore, excellent stress relaxation properties, that is, reducing the applied stress so as to reduce the residual stress, is considered to be a required characteristic.

However, urethane resins and silicone resins such as those disclosed in the Patent Document 1 and Patent Document 2 exhibit high tensile elongation and excellent recoverability, but are known to exhibit low stress relaxation properties. It is possible to increase the stress relaxation properties of urethane resins by altering the types and combinations of polyols and isocyanates used as raw materials or by decreasing the crosslinking density, but doing so causes the recoverability to deteriorate. In addition, urethane resins have a narrow usable temperature range and exhibit low heat resistance, and therefore have the drawback of being limited in terms of scope of use.

Therefore, display devices produced using these resins have problems such as detachment or breakage readily occurring as a result of residual stress caused by close adhesion to free-form surfaces or by significant deformation. Therefore, it is currently the case that flexible display devices exhibit only limited flexibility.

Other types of rubber material also exhibit such problems, and exhibit high recoverability, but low stress relaxation properties. In addition, other thermoplastic materials such as polyethylene are used in a variety of fields due to being flexible and exhibiting high tensile elongation, but the elastic region of tensile elongation is between a few and several tens of percent, and in the region beyond the yield point, elongation caused by plastic deformation occurs. As a result, thermoplastic materials such as polyethylene exhibit excellent stress relaxation properties, but have the problem of not returning to their original shape following elongation (that is, high residual strain rate).

CITATION LIST

Patent Literature

[PTL 1] Patent Document 1: Japanese Patent Application Publication No. 2012-63437

[PTL 2] Patent Document 2: Japanese Patent Application Publication No. 2012-27488

SUMMARY OF INVENTION

The present invention takes into account such circumstances, and addresses the problem of providing a material which is flexible and which exhibits excellent recoverability following extension and stress relaxation properties.

That is, one aspect of the present invention is a resin composition characterized by being able to undergo elastic deformation, having little residual strain rate and exhibiting stress relaxation properties.

Another aspect of the present invention is a film characterized by using the resin composition.

BRIEF DESCRIPTION OF DRAWINGS

FIG. 1 is a graph showing the behavior in a tensile-compression test of a resin composition according to an embodiment of the present invention and a resin composition used for the purpose of comparison.

FIG. 2 is a graph showing the behavior in a stress relaxation properties test of a resin composition according to an embodiment of the present invention and a resin composition used for the purpose of comparison.

DESCRIPTION OF EMBODIMENTS

In the past, a great deal of research was carried out into the flexibility, that is, low elasticity and high elongation, and recoverability of resin materials, but there are almost no examples of reports in which stress relaxation properties could be increased in comparison with these characteristics. This is thought to be because stress relaxation is caused by plastic deformation occurring as a result of creep, and because plastic deformation means that recovery does not occur.

As a result of diligent research, the inventors of the present invention thought that by simultaneously achieving the incompatible characteristics of high stress relaxation properties during tension and excellent recoverability following extension, it would be possible to achieve flexibility and recovery even following deformation and also possible to minimize detachment or breakage of components caused by residual stress, and carried out further research on the basis of these findings, thereby completing the present invention.

Embodiments of the present invention will now be explained in greater detail, but the present invention is not limited to these embodiments.

The resin composition of the present embodiment is a resin composition characterized by being able to undergo elastic deformation, having little residual strain rate and exhibiting stress relaxation properties. By achieving the characteristics of high stress relaxation properties during tension and excellent recoverability following extension in this way, it is thought that it is possible to provide a material which is flexible and which exhibits excellent stress relaxation properties.

In the present embodiment, ability to undergo elastic deformation and having little residual strain rate more specifically means that plastic deformation does not occur and residual strain rate is preferably 3% or lower. In addition, exhibiting stress relaxation properties means that when a force (for example, a tensile force) is applied, the applied stress is reduced, thereby reducing residual stress.

For the sake of convenience, the residual strain rate and stress relaxation properties of the resin composition are defined in the present embodiment by the stress relaxation rate (R) and the residual strain rate α (alpha), as measured in the extension-restoration test described below.

It is preferable for the resin composition of the present embodiment to be a resin composition in which the stress relaxation rate (R) is 20 to 95% and the residual strain rate (α) is 0 to 3%. It is more preferable for the stress relaxation rate (R) to be 30 to 60% and for the residual strain rate (α) to be 0 to 1.5%.

It is thought that a resin composition having a stress relaxation rate and residual strain rate that fall within these ranges exhibits high stress relaxation properties during tension and excellent recoverability following extension, and can give a material having excellent flexibility and stress relaxation properties.

<Extension-Restoration Test>

In the extension-restoration test used in the present embodiment, a piece of resin composition (thickness: 50 micrometer, sample shape: No. 6 type dumbbell (width of measured portion: 4 mm, length of linear portion: 25 mm)) is subjected to an extension process and then a restoration process under the conditions described below using a tensile-compression tester (for example, an Autograph (model AGS-X) manufactured by Shimadzu Corporation) in accordance with ISO 3384, and the stress relaxation rate (R) and the residual strain rate (α) are calculated using the calculation methods described below.

(Extension Process Conditions)

In order to eliminate deflection generated when the test piece is attached to the clamp, deflection correction is carried out at a force of 0.05 N or lower.

Speed of testing: 25 mm/min (0 to 25% extension)
Temperature conditions: 23 degrees Celsius (Restoration Process Conditions)

Speed of testing: 0.1 mm/min (until the tensile force reaches 0±0.05 N)
Temperature conditions: 23 degrees Celsius Stress relaxation rate calculation method: The tensile force is measured at the point when the extension process is complete, and this is defined as the initial tensile force ($F_{AO}$). The amount of strain is then maintained for 5 minutes under the extension/holding conditions, after which the tensile force is measured. This is defined as $F_A(t_5)$. The stress relaxation rate (R) is calculated using the following formula.

$$R = \frac{F_{AO} - F_A(t5)}{F_{AO}} \times 100$$

Residual strain rate calculation method: The amount of strain is measured at the point where the tensile force in the restoration process reaches 0±0.05 N, and this is defined as the residual strain rate (α).

That is, when the extension-restoration test is carried out, the resin composition according to the present embodiment exhibits extension (strain) restoration behavior against a tensile force (the test force) such as that shown by the curve (the almost straight line) in the graph shown in FIG. 1 (this uses the resin composition of Working Example 2, which is described later). In FIG. 1, the vertical axis shows the tensile force (N/mm$^2$) and the horizontal axis shows the extension (strain) (%). The amount of extension shown here essentially means the amount of strain on the resin composition in the present Description.

For purposes of comparison, FIG. 1 also shows the behavior of a conventional silicone film (Comparative Example 14, described later) and a conventional polyethylene film (Comparative Example 15, described later) in the extension-restoration test, but in both of these comparative examples, the upper curve (an approximately straight line for the resin composition of the present embodiment) shows the extension in the extension process and the lower curve (an approximately straight line) shows the restoration (return from extension) in the restoration process.

As shown in FIG. 1, the resin composition of the present embodiment is extended to 25% by a tensile force and then held for 5 minutes in the extension process, the stress is relaxed while holding the resin composition, and the resin composition is then restored in the restoration process until the tensile force reaches 0±0.05 N.

Even after being subjected to this type of extension-restoration test, the residual strain rate in the resin composition of the present embodiment is restored to approximately 1% (that is, the residual strain rate is extremely low). However, in the case of a plastically deforming resin (polyethylene, Comparative Example 15), the residual strain rate is only restored to approximately 8.4% after the extension-restoration test (that is, the residual strain rate is high).

In addition, when held for 5 minutes after the extension process, the conventional plastically deforming resin (polyethylene, Comparative Example 15) only undergoes stress relaxation of approximately 25 to 30%, but the resin composition of the present embodiment undergoes stress relaxation of approximately 20 to 60% while extended.

That is, the resin composition of the present embodiment achieves the special, beneficial and previously unobtainable property of being excellent in terms of both residual strain rate and stress relaxation properties.

In addition, when held for 5 minutes after the extension process, the conventional silicone film (Comparative Example 14) undergoes almost no stress relaxation while extended.

In view of the behavior exhibited by the resin composition of the present embodiment, as shown in FIG. 1, it is understood that the resin composition of the present embodiment is a resin composition which exhibits excellent flexibility and which exhibits particularly excellent recoverability following extension despite undergoing stress relaxation. Such characteristics were not observed in conventional elastically deforming resins and plastically deforming resins, and the resin composition of the present embodiment is an excellent resin composition that can realize such characteristics in, for example, a flexible display device.

A more preferred embodiment is a resin composition which, when extended to 15 to 20% in the extension-restoration test, is such that the slope of the change in tensile force relative to the amount of strain during restoration and that during extension satisfy the following formula: slope during restoration/slope during extension ≤0.95. A more preferred resin composition is one in which the slope during restoration/slope during extension is ≤0.90.

That is, it is preferable for the slope (arrow) of the curve (the approximately straight line) showing the extension process of the resin composition of the present embodiment in FIG. 1, that is, the elastic modulus during extension, to be greater than the slope (arrow) of the curve (the approximately straight line) showing the restoration process, that is, the elastic modulus during restoration.

It is thought that this gives a resin composition having even better stress relaxation properties.

A more preferred embodiment is a resin composition for which a stress value measured at the point of maximum extension (25% extension) is a maximum stress value in the extension-restoration test. Such a resin composition enables higher recoverability to be achieved without the material under going a yield phenomenon.

In addition, it is preferable for the resin composition of the present embodiment to be a resin composition whereby even when the extension process and restoration process in the extension-restoration test are repeated two or more times, the resin composition still satisfies the relationships. This can give a resin composition which exhibits excellent recoverability and which does not lose recoverability even when extended several times. It is thought that such a resin composition exhibits even better flexural tolerance and so on when used in a flexible display device or the like.

Furthermore, it is preferable for the resin composition of the present embodiment to be a resin composition whereby, in cases where measurements are started at the point where the extension process is complete in the stress relaxation properties test described below, the tensile force ($F_{B0}$) immediately after completion of the extension process and the tensile force ($F_B(t_{30})$) 30 minutes after completion of the extension process satisfy the following formula: $0.1 \leq F_B(t_{30})/F_{B0} \leq 0.7$.

A resin composition having such characteristics is one having even better stress relaxation properties, and is extremely useful.

<Stress Relaxation Properties Test>

A piece of resin composition (thickness: 50 micrometer, sample shape: No. 6 type dumbbell (width of measured portion: 4 mm, length of linear portion: 25 mm)) is subjected to an extension process under the conditions described below using a tensile-compression tester in accordance with ISO 3384, and at the point where the extension is complete, the tensile force is measured and defined as the initial tensile force ($F_{B0}$). 30 minutes thereafter, the tensile force ($F_B(t_{30})$) is measured.

(Extension Process Conditions)

In order to eliminate deflection generated when the test piece is attached to the clamp, deflection correction is carried out. The deflection correction is carried out at a force of 0.05 N or lower.

Speed of testing: 25 mm/min (up to 50% extension)
Temperature conditions: 23 degrees Celsius
Extension/holding conditions: Holding for 30 minutes at 50% extension Moreover, it is preferable for the resin composition of the present embodiment to be a resin composition in which even if the extension and holding in the stress relaxation properties test are repeated two or more times (that is, even if a sample is measured again after being restored to its original state under arbitrary conditions following completion of the first test), the resin composition still satisfies the relationships.

FIG. 2 is a graph showing the stress relaxation properties of the resin composition according to the present embodiment when subjected to the stress relaxation properties test. In FIG. 2, the vertical axis shows ($F_B(t_{30})/F_{B0}$), and the horizontal axis shows time (seconds).

As shown in FIG. 2, the resin composition of the present embodiment is a material which exhibits high recoverability and, in cases where the stress ($F_{B0}$) required for 50% extension is maintained, the stress required to maintain 50% extension can be reduced to ($F_B(t_{30})$) after 30 minutes, that is, the stress can be relaxed by approximately 62%.

Conversely, a silicone film (Comparative Example 14), which is a conventional resin, exhibits high recoverability, but exhibits a stress relaxation of 8% under the same conditions as those mentioned above, and a polyethylene film (Comparative Example 15) does not exhibit high recoverability and exhibits a stress relaxation of approximately 25%. That is, such conventional films exhibit high residual stress.

The resin composition of the present embodiment is not particularly limited in terms of composition as long as the characteristics mentioned above are satisfied. It is preferable for the resin composition of the present embodiment to contain at least a thermosetting resin and a curing agent for this resin. Furthermore, an epoxy resin is a preferred example of the thermosetting resin.

A more specific embodiment thereof is, for example, a resin composition that contains (A) a polyrotaxane, (B) a thermosetting resin and (C) a curing agent. These components will now be explained in greater detail.

The polyrotaxane of the component (A) is a molecule having a structure in which a straight chain axial molecule passes through a cyclic molecule and the axial molecule is blocked at the molecular terminals so that the cyclic molecule cannot become detached. A specific example thereof is the polyrotaxane disclosed in Japanese Patent No. 4482633.

Examples of the polyrotaxane (A) able to be used in the present embodiment include a compound in which a molecule having terminal functional groups, which is an axial molecule, is enclathrated by a cyclic molecule, and these terminal functional groups are chemically modified by blocking groups that are sufficiently bulky for the cyclic molecule not to become detached. A molecule having this type of structure is not limited in terms of the structure and type of the constituent molecules, the enclathration rate of the cyclic molecule, the production method, and so on.

For example, axial molecules able to be contained in the polyrotaxane are not particularly limited as long as the molecule has a molecular weight of 10,000 or higher and can be chemically modified by a blocking group, and examples thereof include poly(vinyl alcohol), polyvinylpyrrolidone, poly(meth)acrylic acid cellulose-based resins, polyacrylamide, poly(ethylene oxide), poly(ethylene glycol), poly(propylene glycol), poly(vinyl acetal)-based resins, poly(vinyl methyl ether), polyamines, polyethyleneimines, casein, gelatin, starch, polyolefins, polyesters, poly(vinyl chloride), polystyrene, copolymers such as acrylonitrile-styrene copolymers, acrylic resins, polycarbonates, polyurethanes, poly(vinyl butyral), polyisobutylene, polytetrahydrofuran, polyamides, polyimides, polydienes, polysiloxanes, polyurea, polysulfides, polyphosphazene, polyketones, polyphenylene, polyhaloolefins, and derivatives thereof. Of these, poly(ethylene glycol) can be advantageously used.

In addition, the cyclic molecule able to be contained in the polyrotaxane is a ring-shaped molecule able to be penetrated by a polymer molecule, and is not particularly limited as long as the cyclic molecule has at least one reactive group able to react with a crosslinking agent. Specific examples thereof include cyclodextrin compounds, crown ether compounds, cryptand compounds, macrocyclic amine compounds, calixarene compounds and cyclophane compounds. Of these, cyclodextrin and substituted cyclodextrin compounds are preferred, and substituted cyclodextrin compounds obtained by introducing further reactive groups (functional groups) into the substituted structure are more preferred.

Examples of preferred functional groups introduced into the cyclic molecule of the polyrotaxane include hydroxyl groups, carboxyl groups, acrylic groups, methacrylic groups, epoxy groups, vinyl groups, and the like.

By introducing functional groups into the cyclic molecule in this way, it is possible to crosslink cyclic molecules to each other or crosslink the polyrotaxane and the resin by means of a crosslinking agent. In addition, a resin connected to a polyrotaxane in this way can achieve flexibility.

The structures that block the terminals of the polyrotaxane in the present embodiment (terminal-blocking groups) are not particularly limited as long as these structures are sufficiently bulky for the cyclic molecule not to become detached. Specifically, cyclodextrin groups, adamantane groups, dinitrophenyl groups, trityl groups, and the like can be used, and adamantane groups and the like can be advantageously used.

Molecules able to be used as the cyclic molecule are not particularly limited as long as a liner chain polymer molecule can be enclathrated by the ring of the cyclic molecule. A cyclodextrin is an example of a cyclic molecule able to be advantageously used. In addition, it is preferable for this cyclic molecule to have functional groups. Furthermore, it is preferable for the functional groups to be —OH groups, acrylic groups or methacrylic groups.

The polyrotaxane used in the present embodiment can be synthesized by means of a publicly known method (for example, the methods disclosed in WO 01/83566, Japanese Patent Application Publication No. 2005-154675 or Japanese Patent No. 4482633), but it is also possible to use a commercially available product, specifically SeRM Super Polymer A1000 manufactured by Advanced Softmaterials, Inc.

Next, the thermosetting resin (B) is not particularly limited, and examples thereof include epoxy resins, phenol resins, polyimide resins, urea-based resins, melamine resins, unsaturated polyesters and urethane-based resins, but of these, epoxy resins are preferred.

Specific examples of the epoxy resin include bisphenol A type epoxy resins, bisphenol F type epoxy resins, bisphenol S type epoxy resins, aralkyl epoxy resins, phenol novolac type epoxy resins, alkylphenol novolac type epoxy resins, biphenol type epoxy resins, naphthalene type epoxy resins, dicyclopentadiene type epoxy resins, epoxidized condensation products of phenol compounds and aromatic aldehydes having phenolic hydroxyl groups, triglycidylisocyanurates and alicyclic epoxy resins. Depending on the circumstances, these epoxy resins can be used singly or as a combination of two or more types thereof.

A more preferred example of the epoxy resin is an epoxy resin which contains 2 or more epoxy groups and 3 or more methyl groups per molecule and which has a molecular weight of 500 or higher. This type of epoxy resin can be a commercially available one, for example JER1003 (manufactured by Mitsubishi Chemical Corp., 7 to 8 methyl groups, 2 functional groups, molecular weight 1300), EXA-4816 (manufactured by DIC Corporation, molecular weight 824, many methyl groups, 2 functional groups), YP50 (manufactured by Nippon Steel & Sumikin Chemical Co., Ltd., molecular weight 60,000 to 80,000, many methyl groups, 2 functional groups), or the like.

In addition, epoxy resins such as those mentioned above can be used singly or as a combination of two or more types thereof.

The curing agent (C) is not particularly limited as long as the curing agent can act as a curing agent for the thermosetting resin of component (B). In particular, examples of preferred curing agents able to be used as curing agents for epoxy resins include phenol resins, amine-based compounds, acid anhydrides, imidazole-based compounds, sulfide compounds and dicyandiamide. In addition, it is possible to use a photoinitiator, a UV initiator or a thermal cationic initiator. Depending on the circumstances, these curing agents can be used singly or as a combination of two or more types thereof.

In addition, the polyrotaxane-containing resin composition of the present embodiment may further contain a crosslinking agent, and this crosslinking agent is not particularly limited as long as it is possible to create a structure in which at least a part of the cyclic molecule in the polyrotaxane (at least 1 reactive group in the cyclic molecule of the polyrotaxane) is crosslinked.

More specifically, it is possible to use an isocyanate, cyanuric chloride, trimesoyl chloride, terephthaloyl chloride, epichlorohydrin, dibromobenzene, glutaraldehyde, phenylene diisocyanate, tolylene diisocyanate, divinylsulfone, 1,1-carbonyldiimidazole, an alkoxysliane, and the like.

In the present embodiment, the number of functional groups in the crosslinking agent is not limited, but it is preferable for a molecule of the crosslinking agent to have 2 or more functional groups in order to crosslink cyclic molecules of the polyrotaxane to each other or crosslink the cyclic molecule and a resin such as that described below. In addition, in cases where the crosslinking agent contains a plurality of functional groups, these functional groups may be the same or different.

Furthermore, crosslinking agents that are compatible with polyrotaxanes are more preferred, and in cases where a polyrotaxane containing a cyclic molecule having a hydroxyl group is used as the polyrotaxane of component (A), an isocyanate compound, a derivative thereof, or the like can be advantageously used as the crosslinking agent.

This isocyanate resin is not particularly limited. In addition, it is also possible to use a blocked isocyanate resin having a blocked isocyanate group.

Meanwhile, in cases where a polyrotaxane containing a cyclic molecule having an acrylic group or a methacrylic group is used as the polyrotaxane of component (A), it is possible to add an acrylic resin as a reactive resin. This acrylic resin is not particularly limited.

The proportions of the components in the resin composition are not particularly limited as long as the effect of the present invention can be achieved, but are 10 to 80 parts by mass, and preferably approximately 30 to 50 parts by mass, of the polyrotaxane (A), 10 to 89.9 parts by mass, and preferably 30 to 50 parts by mass, of the thermosetting resin (B), and 0.1 to 30 parts by mass, and preferably approximately 0.1 to 20 parts by mass, of the curing agent (C), relative to a total of 100 parts by mass of the components (A) to (C). Moreover, in cases where the resin composition of the present embodiment contains an isocyanate resin as a crosslinking agent, it is possible to add 0 to 50 parts by mass, and preferably 10 to 40 parts by mass, of the isocyanate resin to the polyrotaxane component (A).

Furthermore, the resin composition according to the present embodiment may, if necessary, contain other additives, such as a curing catalyst (a curing accelerator), a flame retardant, an auxiliary flame retardant, a leveling agent or a coloring agent, at quantities whereby the effect of the present invention is not impaired.

The method for producing the polyrotaxane-containing resin composition of the present embodiment is not particularly limited, and it is possible to obtain the resin composition of the present embodiment by, for example, homogeneously mixing a polyrotaxane, a curing agent, a crosslinking agent, a thermosetting resin and a solvent. The solvent used is not particularly limited, and can be toluene, xylene, methyl ethyl ketone, acetone, or the like. These solvents can be used singly or as a combination of two or more types thereof. In addition, if necessary, it is possible to blend an organic solvent or a variety of additives in the resin composition in order to adjust the viscosity of the composition.

By heating and drying the resin composition obtained in the manner described above, it is possible to cure the composition while evaporating off the solvent, thereby obtaining a film.

The method and apparatus used to heat and dry the resin composition, and the conditions used therefor, may be similar means to those used in the past or means obtained by improving those used in the past. The specific heating temperature and period can be set as appropriate according to the crosslinking agent and solvent used, and the like, but by heating and drying for a period of 60 to 120 minutes at a temperature of 50 to 200 degrees Celsius, for example, it is possible to cure the resin composition.

Next, another example of a specific embodiment of the resin composition of the present embodiment is, for example, a resin composition which contains (D) an epoxy resin, which is characterized by having a modified group that is modified by an alkylene oxide having 2 to 3 carbon atoms, containing this modified group at a quantity of 4 moles or more relative to 1 mole of epoxy groups in the molecule, having 2 moles or more of epoxy groups and having an epoxy equivalent quantity of 450 eq/mol or higher, and (E) a curing agent.

Specific examples of the epoxy resin (D) include a propylene oxide adduct type bisphenol A type epoxy resin (EP4003S manufactured by Adeka Corporation) and an ethylene oxide adduct type hydroxyphenylfluorene type epoxy resin (EG-280 manufactured by Osaka Gas Chemicals Co., Ltd.).

In addition, the epoxy resin-containing resin composition of the present embodiment may further contain an epoxy resin other than the epoxy resin (D) described above, such as a bisphenol A type epoxy resin, a bisphenol F type epoxy resin, a bisphenol S type epoxy resin, an aralkyl epoxy resin, an aliphatic epoxy resin or an alicyclic epoxy resin, at a quantity whereby the effect of the present invention is not impaired.

In such cases, the blending proportion of the epoxy resin (D) in the overall epoxy resin component is approximately 60 to 99 mass %, and preferably approximately 80 to 95 mass %.

The curing agent (E) can be one that is publicly known as a curing accelerator for epoxy resins. Specifically, a curing agent selected from among phenolic resins, acid anhydrides and sulfonium salts is preferred from the perspective of curing properties and, if necessary, it is possible to use a combination of this type of curing agent and a curing accelerator such as an imidazole-based compound or a combination of two or more of these curing agents.

The phenol curing agent can be a monomer, oligomer or polymer having 2 or more phenolic hydroxyl groups in the molecule and is not particularly limited in terms of molecular weight or molecular structure, but it is possible to use, for example, are resin obtained by subjecting a phenol compound, such as phenol, cresol, resorcin, catechol, bisphenol A, bisphenol F, phenylphenol or aminophenol, and/or a naphthol compound, such as α-naphthol, β-naphthol or dihydroxynaphthalene, and a compound having an aldehyde group, such as formaldehyde, to condensation or co-condensation in the presence of an acidic catalyst, examples of such resins being phenol novolac resins and cresol novolac resins, or a phenol aralkyl resin synthesized from a phenol compound and/or a naphthol compound and dimethoxy para-xylene or bis(methoxymethyl)biphenyl, and these curing agents can be used either singly or as a combination of two or more types thereof.

Examples of acid anhydride-based curing agents include maleic acid anhydride, succinic acid anhydride, itaconic acid anhydride, citraconic acid anhydride, phthalic acid anhydride, 1,2,3,6-tetrahydrophthalic acid anhydride, 3,4,5,6-tetrahydrophthalic acid anhydride, hexahydrophthalic acid anhydride, 4-methylhexahydrophthalic acid anhydride, 3-methyl-1,2,3,6-tetrahydrophthalic acid anhydride, 4-methyl-1,2,3,6-tetrahydrophthalic acid anhydride and methyl-3,6-endomethylene-1,2,3,6-tetrahydrophthalic acid anhydride.

Examples of sulfonium salt-based curing agents include alkyl sulfonium salts, benzyl sulfonium salts, dibenzyl sulfonium salts and substituted benzyl sulfonium salts. Specific examples thereof include alkyl sulfonium salts such as 4-acetophenyldimethyl sulfonium hexafluoroantimonate, 4-acetoxyphenyldimethyl sulfonium hexafluoroarsenate, dimethyl-4-(benzyloxycarbonyloxy)phenyl sulfonium hexafluoroantimonate, dimethyl-4-(benzoyloxy)phenyl sulfonium hexafluoroantimonate, dimethyl-4-(benzoyloxy)phenyl sulfonium hexafluoroarsenate and dimethyl-3-chloro-4-acetoxyphenyl sulfonium hexafluoroantimonate; benzyl sulfonium salts such as benzyl-4-hydroxyphenylmethyl sulfonium hexafluoroantimonate, benzyl-4-hydroxyphenylmethyl sulfonium hexafluorophosphate, 4-acetoxyphenylbenzylmethyl sulfonium hexafluoroantimonate, benzyl-4-methoxyphenylmethyl sulfonium hexafluoroantimonate, benzyl-2-methyl-4-hydroxyphenylmethyl sulfonium hexafluoroantimonate, benzyl-3-chloro-4-hydroxyphenylmethyl sulfonium hexafluoroarsenate and 4-methoxybenzyl-4-hydroxyphenylmethyl sulfonium hexafluorophosphate; dibenzyl sulfonium salts such as dibenzyl-4-hydroxyphenyl sulfonium hexafluoroantimonate, dibenzyl-4-hydroxyphenyl sulfonium hexafluorophosphate, 4-acetoxyphenyldibenzyl sulfonium hexafluoroantimonate, dibenzyl-4-methoxyphenyl sulfonium hexafluoroantimonate, dibenzyl-3-chloro-4-hydroxyphenyl sulfonium hexafluoroarsenate, dibenzyl-3-methyl-4-hydroxy-5-tert-butylphenyl sulfonium hexafluoroantimonate and benzyl-4-methoxybenzyl-4-hydroxyphenyl sulfonium hexafluorophosphate; and substituted benzyl sulfonium salts such as p-chlorobenzyl-4-hydroxyphenylmethyl sulfonium hexafluoroantimonate, p-nitrobenzyl-4-hydroxyphenylmethyl sulfonium hexafluoroantimonate, p-chlorobenzyl-4-hydroxyphenylmethyl sulfonium hexafluorophosphate, p-nitrobenzyl-3-methyl-4-hydroxyphenylmethyl sulfonium hexafluoroantimonate, 3,5-dichlorobenzyl-4-hydroxyphenylmethyl sulfonium hexafluoroantimonate and o-chlorobenzyl-3-chloro-4-hydroxyphenylmethyl sulfonium hexafluoroantimonate.

The proportions of the components in the resin composition are not particularly limited as long as the effect of the present invention can be achieved, but are 50 to 99 parts by mass, and preferably approximately 60 to 80 parts by mass, of the epoxy resin (D) and 1 to 50 parts by mass, and preferably approximately 1 to 40 parts by mass, of the curing agent (E) relative to 100 parts by mass of the overall resin composition.

Furthermore, the resin composition according to the present embodiment may, if necessary, contain other additives, such as a curing catalyst (a curing accelerator), a flame retardant, an auxiliary flame retardant, a leveling agent or a coloring agent, at quantities whereby the effect of the present invention is not impaired.

The method for producing the epoxy resin-containing resin composition of the present embodiment is not particularly limited, and it is possible to, for example, homogeneously mix the epoxy resin, the curing agent and a solvent. The solvent used is not particularly limited, and can be toluene, xylene, methyl ethyl ketone, acetone, or the like. These solvents can be used singly or as a combination of two or more types thereof. Furthermore, if necessary, it is possible to blend an organic solvent or a variety of additives in the resin composition in order to adjust the viscosity of the composition.

By heating and drying the resin composition obtained in the manner described above, it is possible to cure the composition while evaporating off the solvent, thereby obtaining a film.

The method and apparatus used to heat and dry the resin composition, and the conditions used therefor, may be similar means to those used in the past or means obtained by improving those used in the past. The specific heating temperature and period can be set as appropriate according to the crosslinking agent and solvent used, and the like, but by heating and drying for a period of 60 to 180 minutes at a temperature of 130 to 200 degrees Celsius, for example, it is possible to cure the resin composition.

A molded body that is a cured product of the polyrotaxane-containing resin composition or the epoxy resin-containing resin composition, which are obtained as described above, can be used as a material for electronic components in a variety of applications. In particular, such a molded body has excellent flexibility, stress relaxation properties and recoverability and can be bent or expanded and contracted, and is therefore extremely advantageous as a material used in bendable electronic paper, organic EL displays, solar cells, RFID devices, pressure sensors and the like.

In addition, it is possible to form wiring on a support body by using the resin composition of the present embodiment. The method for forming the wiring is not particularly limited, but it is possible to use a publicly known method, such as ink jet printing, screen printing, stencil printing, intaglio printing, relief printing, or planography.

In addition, it is preferable for the resin composition of the present embodiment to be formed as a film on a support body, and by using this type of film, it is thought to be possible to obtain a flexible display device or the like which can closely follow free-form surfaces and adapt to significant deformation. The method for forming the film is not particularly limited, and it is possible to use a commonly used coating machine or the like, such as a spin coater, a bar coater or a comma coater.

In addition, the support body used in the film of the present embodiment is not particularly limited, and it is possible to use a hard support body, such as a glass, a metal or a printed wiring board, or a flexible or stretchable support body, such as a resin film, a flexible substrate or an elastomer.

The wiring or film formed on a support body such as those mentioned above can be used together with the support body, but can also be used by being detached from the support body. Specifically, an example of an article used together with a support body is a flexible substrate or shield board obtained by forming wiring on a film, and an example of an article that is used by being detached from a support body is a heat-dissipating film or a case in which wiring is formed by offset printing.

The present Description discloses a variety of features, as described above, but of these, the main features will now be summarized.

One aspect of the present invention is a resin composition characterized by being able to undergo elastic deformation, having little residual strain rate and exhibiting stress relaxation properties. By achieving the characteristics of high stress relaxation properties during tension and excellent recoverability following extension in this way, it is thought that it is possible to provide a material which is flexible and which exhibits excellent stress relaxation properties.

In addition, by using this type of resin composition that exhibits both high stress relaxation properties and recoverability, stress generated by these deformations and the like is relaxed and it is possible to suppress detachment and breakage between components, which occurred in conventional display devices and the like. Furthermore, the resin composition according to the present invention can return to its original shape when released from deformations and the like.

By using this type of excellent material, it is possible to obtain a flexible display device and the like which can closely follow free-form surfaces and adapt to significant deformation. In addition, the resin composition according to the present invention is characterized by exhibiting both high stress relaxation properties and recoverability, and is therefore industrially very useful not only in flexible display devices, but also in a wide range of technical fields, such as optics, electronics, adhesives and medicines.

In addition, in the resin composition, it is preferable for the stress relaxation rate (R) and the residual strain rate ($\alpha$), as measured in the extension-restoration test described above, to satisfy the following relationships: $20\% \leq R \leq 95\%$ and $0\% \leq \alpha \leq 3\%$.

By constituting in this way, it is possible to more reliably obtain a material which exhibits both high stress relaxation properties during tension and excellent recoverability following extension.

Furthermore, when the resin composition is extended to 15 to 20% in the extension-restoration test, it is preferable for the slope of the change in tensile force relative to the amount of strain during restoration and that during extension to satisfy the formula: slope during restoration/slope during extension ≤0.95.

By constituting in this way, it is thought to be possible to obtain a material having even better stress relaxation properties.

In addition, in the resin composition, the stress value measured at the point of maximum extension (25% extension) is the maximum stress value in the extension-restoration test, and in cases where measurements are started at the point where the extension process is complete in the stress relaxation properties test described above, it is preferable for the tensile force ($F_{B0}$) immediately after completion of the extension process and the tensile force ($F_B(t_{30})$) 30 minutes after completion of the extension process satisfy the following formula. $0.1 \le F_B(t_{30})/F_{B0} \le 0.7$.

By constituting in this way, it is possible to more reliably obtain a material having particularly excellent stress relaxation properties and recoverability following extension.

Furthermore, even when the tests are repeated two or more times using the resin composition, the resin composition behaves in such a way that the formulae described above are still satisfied. In this way, it is possible to obtain a material having even better recoverability.

Furthermore, it is preferable for the resin composition to contain at least a thermosetting resin and a curing agent for this resin. In this way, it is possible to more reliably obtain a material having particularly excellent stress relaxation properties and recoverability following extension.

In addition, it is preferable for the thermosetting resin to be an epoxy resin. In this way, it is possible to achieve both high stress relaxation properties and high recoverability, and also possible to achieve heat resistance and toughness.

Another aspect of the present invention is a film characterized by using the resin composition. By using this type of film, it is possible to obtain a flexible display device and the like which can closely follow free-form surfaces and adapt to significant deformation.

The present invention will now be explained in greater detail through the use of working examples, but is in no way limited to these working examples.

EXAMPLES

First, the various materials used in the present working examples are as follows.
(Polyrotaxanes)
  Polyrotaxane ("A1000" manufactured by Advanced Softmaterials, Inc., containing PEG as the axial molecule, α-cyclodextrin as the cyclic molecule, and OH groups as reactive groups)
  Polyrotaxane ("AU1000" manufactured by Advanced Softmaterials, Inc., containing PEG as the axial molecule, α-cyclodextrin as the cyclic molecule, and methacrylic groups as reactive groups) (thermosetting resin)
  Epoxy resin ("VG-3101" manufactured by Printec Co., 3 functional groups, 3 methyl groups, molecular weight 550)
  Epoxy resin ("JER1003" manufactured by Mitsubishi Chemical Corp., 7 to 8 methyl groups, 2 functional groups, molecular weight 1300)
  Epoxy resin ("EXA-4816" manufactured by DIC Corporation, molecular weight 824, many methyl groups, 2 functional groups)
  Epoxy resin "YP50" manufactured by Nippon Steel & Sumikin Chemical Co., Ltd., molecular weight 60,000 to 80,000, many methyl groups, 2 functional groups)
  Epoxy resin ("EP-4088S" manufactured by Adeka Corporation, 2 functional groups, dicyclopentadiene type)
  Epoxy resin ("EX-212L" manufactured by Nagase ChemteX Corporation, aliphatic epoxy resin)
  Epoxy resin ("Epiclon 850 S" manufactured by DIC Corporation, liquid bisphenol A type epoxy compound)
  Epoxy resin ("YL7175-500" manufactured by Mitsubishi Chemical Corp., rubber elastic epoxy resin)
  Propylene oxide adduct type bisphenol A type epoxy resin ("EP4003S" manufactured by Adeka Corporation)
  Ethylene oxide adduct type hydroxyphenylfluorene type epoxy resin ("EG-280" manufactured by Osaka Gas Chemicals Co., Ltd.)
(Photocurable Resin)
  Ethoxylated bisphenol A diacrylate ("A-BPE-10" manufactured by Shin-Nakamura Chemical Co., Ltd.)
(Curing Agents)
  Polyfunctional phenol-based curing agent ("GPH-103" manufactured by Nippon Kayaku Co., Ltd., biphenyl aralkyl type phenol compound)
  Epoxy resin curing agent ("YH-306" manufactured by Mitsubishi Chemical Corp., acid anhydride-based curing agent)
  Imidazole-based curing accelerator ("2E4MZ" manufactured by Shikoku Chemicals Corporation, 2-ethyl-4-methylimidazole)
  Cationic curing agent ("SI-150" manufactured by Sanshin Chemical Industry Co., Ltd., sulfonium hexafluoroantimonate)-Amine-based curing agent ("ETHACURE 100" manufactured by Albemarle Corporation, diethyltoluene diamine)
  Radical curing agent ("Perhexa HC" manufactured by NOF Corporation, dihexylperoxycyclohexane) (Other additives)
  Crosslinking agent (isocyanate, "DN 950" manufactured by DIC Corporation)
  Difunctional methacrylate ("NK Ester 2G" manufactured by Shin-Nakamura Chemical Co., Ltd., di(ethylene glycol) dimethacrylate)

Examples 1 to 7 and Comparative Examples 1 to 8

Resin compositions of Examples 1 to 7 and Comparative Examples 1 to 8 were prepared by adding the formulation compositions (parts by mass) shown in Table 1 below to a solvent (methyl ethyl ketone) so that the solid content concentration in the resin composition was 40 mass %, and then homogeneously mixing (300 RPM for 30 minutes).

The thus obtained resin composition was coated on a PET film (support body) having a thickness of 75 micrometer using a bar coater, the composition was then dried for 10 minutes at 100 degrees Celsius so as to remove the solvent, and the composition was then cured by being heated for 60 minutes at 170 degrees Celsius.

The obtained cured product was formed at a thickness of 50 micrometer in the shape of a No. 6 type dumbbell (width of measured portion: 4 mm, length of linear portion: 25 mm), and used as a sample for the following evaluation.

<Extension-Restoration Test>

In the extension-restoration test used in the present embodiment, the samples of the working examples and comparative examples were subjected to an extension process and then a restoration process under the conditions described below, and the stress relaxation rate (R) and the residual strain rate ($\alpha$) were calculated using the calculation methods described below.

(Extension Process Conditions)

In order to eliminate deflection generated when the test piece was attached to the clamp, deflection correction was carried out at a force of 0.05 N or lower.

Speed of testing: 25 mm/min (0 to 25% extension)
Temperature conditions: 23 degrees Celsius
Extension/holding conditions: Holding for 5 minutes at 25% extension (Restoration Process Conditions)

Speed of testing: 0.1 mm/min (until the tensile force reaches 0±0.05 N)
Temperature conditions: 23 degrees Celsius Stress relaxation rate calculation method: The tensile force was measured at the point when the extension process is complete, and this was defined as the initial tensile force ($F_{A0}$). The amount of strain was then maintained for 5 minutes under the extension/holding conditions, after which the tensile force was measured. This was defined as $F_A(t_{10})$. The stress relaxation rate (R) was calculated using the following formula.

$$R = \frac{F_{AO} - F_A(t5)}{F_{AO}} \times 100$$

Residual strain rate calculation method: The amount of strain was measured at the point where the tensile force in the restoration process reached 0±0.05 N, and this was defined as the residual strain rate ($\alpha$).

The obtained stress relaxation rates (R) and residual strain rates ($\alpha$) are shown in Table 1.

Furthermore, when the resin compositions were extended to 15 to 20% in the extension-restoration test, the slope of the change in tensile force relative to the amount of strain during restoration and that during extension (slope during restoration/slope during extension) were determined. These results are also shown in Table 1.

<Stress Relaxation Properties Test>

The samples of the working examples and comparative examples were subjected to an extension process under the conditions described below using a tensile-compression tester in accordance with ISO 3384, and at the point where the extension was complete, the tensile force was measured and defined as the initial tensile force ($F_{B0}$). 30 minutes thereafter, the tensile force ($F_B(t_{30})$) was measured.

(Extension Process Conditions)

In order to eliminate deflection generated when the test piece was attached to the clamp, deflection correction was carried out. The deflection correction was carried out at a force of 0.05 N or lower.

Speed of testing: 25 mm/min (up to 50% extension)
Temperature conditions: 23 degrees Celsius
Extension/holding conditions: Holding for 30 minutes at 50% extension In addition, the value of $F_B(t_{30})/F_{B0}$ was calculated. The results are shown in Table 1.

TABLE 1

| | | Example 1 | Example 2 | Example 3 | Example 4 | Example 5 | Example 6 | Example 7 | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|---|---|---|---|---|---|---|---|
| Component (A) | A1000 | 100 | 100 | 100 | 100 | 100 | 100 | 100 | 100 | 100 | 100 | 100 | 100 | 100 | 100 | 100 |
| Component (B) | JER1003 | 75 | 100 | 60 | | | | 83 | | | | | | | | |
| | EXA-4816 | | | | | | | | | | | | | | | 150 |
| | YP50 | | | | 100 | | | | | | | | | | | |
| | EP4088S | | | | | 100 | | | | | | | | | | |
| | EX-212L | | | | | | 135 | | | | | | | | | |
| | 850S | | | | | | | | 100 | | | | | | | |
| | YL7175-500 | | | | | | | | | 100 | | | | | 50 | |
| Component (C) | GPH103 | | | 40 | | | | | | | | | | | | |
| | Kayahard A-A | | | | | | | 17 | | | 100 | | | | | |
| | 2E4MZ | 1.1 | 1.5 | 0.3 | 2 | 1.5 | 2 | 0.3 | 1.5 | 1.5 | 1.5 | 1.5 | | | | |
| Added components | DN950 | | | | | | | | | | | | 200 | | | |
| | NK Ester 2G | | | | | | | | | | | | 3 | | 0.75 | 2.25 |
| (A) (B) (C) total | | 45 | 45 | 45 | 45 | 45 | 45 | 45 | 45 | 45 | 45 | 45 | 45 | 45 | 45 | 45 |
| Total | | 221.1 | 246.5 | 245.3 | 247.0 | 246.5 | 282.0 | 245.3 | 246.5 | 246.5 | 246.5 | 246.5 | 203.0 | 145.0 | 195.8 | 297.3 |
| Stress relaxation rate (R) (20 to 95%) | | 25.3% | 31.0% | 51.1% | 43.0% | 39.5% | 63.0% | 21.6% | 3.7% | 1.8% | 11.0% | 1.3% | 1.4% | 2.0% | 5.9% | 82.0% |
| Residual strain rate (α) (0 to 3%) | | 0.6% | 0.8% | 2.8% | 2.7% | 1.1% | 2.4% | 2.6% | 2.1% | 1.3% | 0.7% | 0.3% | 1.5% | 0.5% | 0.2% | 7.3% |
| Slope during restoration/slope during extension (0 to 0.95) | | 0.91 | 0.86 | 0.92 | 0.92 | 0.83 | 0.89 | 0.94 | 1.19 | 0.91 | 0.97 | 1.02 | 1.07 | 1.04 | 0.99 | 0.98 |
| F(t30)/F0 (0.1 to 0.7) | | 0.62 | 0.38 | 0.41 | 0.6 | 0.67 | 0.42 | 0.67 | 0.93 | 0.96 | 0.91 | 0.99 | 0.96 | 0.97 | 0.98 | 0.24 |

Examples 8 to 12 and Comparative Examples 9 to 12

Resin compositions of Examples 8, 11 and 12 and Comparative Examples 11 and 12 were prepared by adding the formulation compositions (parts by mass) shown in Table 2 below to a solvent (methyl ethyl ketone) so that the solid content concentration in the resin composition was 60 mass %, and homogeneously mixing (300 RPM for 30 minutes).

The thus obtained resin composition was coated on a PET film (support body) having a thickness of 75 micrometer using a bar coater, the composition was then dried for 10 minutes at 100 degrees Celsius so as to remove the solvent, and the composition was then cured by being heated for 120 minutes at 170 degrees Celsius.

In addition, for Examples 9 and 10 and Comparative Examples 9 and 10, resin compositions were prepared at a solid content concentration of 100 mass % by homogeneously mixing (300 RPM for 30 minutes) the components.

The thus obtained resin composition was coated on a copper foil (support body) having a thickness of 35 micrometer using a bar coater and placed in a sealed state, and the composition was then cured by being heated for 120 minutes at 170 degrees Celsius.

The obtained cured product was formed in the shape of a No. 6 type dumbbell having a thickness of 50 micrometer (width of measured portion: 4 mm, length of linear portion: 25 mm), used as a sample for the following evaluation, and the extension-restoration test and stress relaxation properties test were carried out in the same way as in Working Example 1.

These results are shown in Table 2.

erability. By simultaneously achieving the incompatible properties of high stress relaxation properties during tension and excellent recoverability following extension, it is thought that the resin composition according to the present invention is flexible, can be restored even after being deformed, and can minimize detachment and breakage between components caused by residual stress. In addition, by using the resin composition of the present invention, it is possible to provide a flexible display device or the like which can closely follow free-form surfaces and adapt to significant deformation. That is, a display layer formed from the resin composition according to the present invention in an electronic paper or the like can be freely deformed to a greater extent than previous flexible display devices and, for example, exhibits the excellent characteristic of hardly detaching or breaking as a result of residual stress even when significantly bent. Furthermore, the resin composition according to the present invention is flexible and has little residual strain rate, and can therefore return to almost its original shape following extension due to having a large tensile elongation (that is, an extremely high restorative force following extension).

Comparative Examples 13 to 16

A comparison was made between the resin composition of the present invention and conventional flexible resins (elastically deforming resins and plastically deforming resins) and materials. Film samples were prepared in the same way as Working Example 1, except that a urethane polymer ("HUX-561" manufactured by Adeka Corporation) was used as a urethane-based material (Comparative Example

TABLE 2

| | | Example 8 | Example 9 | Example 10 | Example 11 | Example 12 | Comparative Example 9 | Comparative Example 10 | Comparative Example 11 | Comparative Example 12 |
|---|---|---|---|---|---|---|---|---|---|---|
| Main components | Propylene oxide adduct type bisphenol A epoxy resin | 100 | 100 | — | — | — | — | — | — | 100 |
| | Ethylene oxide adduct type hydroxyphenylfluorene epoxy resin | — | — | 100 | 100 | 100 | — | — | — | — |
| | JER1003 | — | — | — | — | — | 100 | 100 | — | — |
| | A-BPE-10 | — | — | — | — | — | — | — | 100 | — |
| Curing agents | GPH-103 | 49 | — | — | 49 | — | — | 42 | — | — |
| | YH-306 | — | 51 | 51 | — | — | 33 | — | — | — |
| | SI-150 | — | — | — | — | 5 | — | — | — | — |
| | ETHACURE100 | — | — | — | — | — | — | — | — | 9 |
| | 2E4MZ | 0.15 | 0.15 | 0.15 | 0.15 | — | 0.13 | 0.14 | — | 1.9 |
| | Perhexa HC | — | — | — | — | — | — | — | 0.1 | — |
| Total | | | | | | | | | | |
| Stress relaxation rate (R) (20 to 95%) | | 53.2% | 45.0% | 41.1% | 82.7% | 64.0% | 90.0% | *1 | 2.1% | *2 |
| Residual strain rate (α) (0 to 3%) | | 2.7% | 2.6% | 2.1% | 2.8% | 1.9% | 18.5% | *1 | 16.3% | *2 |
| Slope during restoration/slope during extension (0 to 0.95) | | 0.83 | 0.85 | 0.81 | 0.61 | 0.78 | 1.12 | *1 | 1.11 | *2 |
| F(t30)/F0 (0.1 to 0.7) | | 0.41 | 0.46 | 0.5 | 0.16 | 0.36 | 0.22 | *1 | 0.97 | *2 |

In Table 2, *1 means that measurement was not possible due to breakage occurring during the test, and *2 means that a film was not formed and a sample could not be prepared.

(Results and Discussion)

The results show that the resin composition according to the present invention is a flexible material that is particularly excellent in terms of stress relaxation properties and recov- 13), a silicone film ("SK Clear Sheet" manufactured by SK KAKEN Co., Ltd.) was used as a silicone-based material (Comparative Example 14), a polyethylene film ("UF421" manufactured by Japan Polyethylene Corporation) was used as a thermoplastic material (Comparative Example 15) and an α gel ("α Gel Sheet" manufactured by Taica Corporation) was used as a gel-like material (Comparative Example 16)

were used instead of the resin composition according to the present invention, and these film samples were subjected to the extension-restoration test and stress relaxation properties test.

These results are shown in Table 3. Moreover, Table 3 also shows the results of Example 2 for the purpose of comparison.

TABLE 3

|  |  | Example 2 | Comparative Example 13 | Comparative Example 14 | Comparative Example 15 | Comparative Example 16 |
|---|---|---|---|---|---|---|
| Present invention material |  | O |  |  |  |  |
| Urethane-based | Urethane polymer |  | O |  |  |  |
| Silicone-based | Silicone film |  |  | O |  |  |
| Thermoplastic | Polyethylene film |  |  |  | O |  |
| Gel-like | α gel |  |  |  |  | O |
| Stress relaxation rate (R) (20 to 95%) |  | 31% | 35% | 1% | 31% | 4% |
| Residual strain rate (α) (0 to 3%) |  | 0.8% | 5.9% | 0.1% | 8.4% | 0.0% |
| Slope during restoration/ slope during extension (0 to 0.95) |  | 0.86 | 0.87 | 0.99 | 58.7 | 0.92 |
| F(t30)/F0 (0.1 to 0.7) |  | 0.38 | 0.52 | 0.92 | 0.75 | 0.95 |

(Results and Discussion)

Compared to the resin composition of the present invention (Example 2), which is excellent in terms of stress relaxation properties and recoverability, a urethane-based material (Comparative Example 13) exhibited similar stress relaxation properties but exhibited a residual strain rate of approximately 5% and low recoverability. In addition, Comparative Example 10, which used a silicone-based material, and Comparative Example 14, which used a gel-like material, each exhibited a stress relaxation rate of only a few percent. Meanwhile, Comparative Example 15, which used polyethylene (a thermoplastic material) exhibited a high residual strain rate in excess of 8%.

The results show that the resin composition according to the present invention is a flexible material that is particularly superior to the variety of conventional materials used in terms of stress relaxation properties and recoverability.

This application is based on Japanese Patent Application No. 2013-212790, which was filed on Oct. 10, 2013, and the contents of this earlier application are included in the present application.

In order to embody the present invention, the present invention has been appropriately and adequately explained by means of the specific embodiments, but it should be recognized that a person skilled in the art could easily amend and/or reform the embodiments. Therefore, as long as amended or reformed modes carried out by a person skilled in the art do not depart from the scope of the claims described in the claims of the present invention, these amended or reformed modes are interpreted as being encompassed by the scope of the claims.

INDUSTRIAL APPLICABILITY

The present invention exhibits broad industrial applicability not only in flexible display devices, but also in a wide range of technical fields, such as optics, electronics, adhesives and medicines.

The invention claimed is:

1. A thermosetting resin composition,
wherein the resin composition contains at least
   (A) a polyrotaxane,
   (B) an epoxy resin which contains 2 or more epoxy groups and 3 or more methyl groups per molecule and which has a molecular weight of 500 or higher and
   (C) a curing agent; and
wherein the proportion of epoxy resin is 30 to 50 parts by mass with respect to 100 parts by mass of polyrotaxane, epoxy resin and curing agent.

2. The thermosetting resin composition according to claim 1,
wherein a cured product of the resin composition is characterized by being able to undergo elastic deformation, having little residual strain rate and exhibiting stress relaxation properties,
wherein a stress relaxation rate (R) and a residual strain rate (α), as measured in an extension-restoration test, satisfy the following relationships:
20%≤R≤95% and
0%≤α≤3%
wherein in the extension-restoration test, a piece of a cured product of the resin composition having a thickness of 50 micrometer and a shape of No. 6 dumbbell having a width of measured portion of 4 mm and a length of linear portion of 25 mm being subjected to an extension process and then a restoration process under extension process conditions using a tensile-compression tester in accordance with ISO 3384, and the stress relaxation rate (R) and the residual strain rate (α) being calculated using the calculation methods described below,
wherein extension process conditions are as follows:
   deflection correction is carried out at a force of 0.05 N or lower,
   speed of testing is 25 mm/min from 0 to 25% extension; and
   temperature is 23° C.,
wherein extension/holding conditions are holding for 5 minutes at 25% extension;
wherein restoration process conditions are as follows:
   a speed of testing is 0.1 mm/min until the tensile force reaches 0±0.05 N; and
   temperature is 23° C.; and
a stress relaxation rate calculation method of measuring the tensile force when the extension process is complete includes
   determining an initial tensile force ($F_{A0}$), then
   the amount of strain being maintained for 5 minutes under the extension/holding conditions, after which the tensile force is measured to determine $F_A(t_5)$, with the stress relaxation rate (R) being calculated using the following formula:

$$R = \frac{F_{AO} - F_A(t5)}{F_{AO}} \times 100$$

wherein the residual strain rate is calculated as the amount of strain being measured at the point where the tensile force in the restoration process reaches 0±0.05 N, and this being defined as the residual strain rate (α).

3. The resin composition according to claim 2,
wherein when the extension is 15 to 20% in the extension-restoration test, the slope of the change in tensile force relative to the amount of strain during restoration and that during extension satisfy the following formula:
slope during restoration / slope during extension ≤0.95.

4. The resin composition according to claim 2, wherein
a stress value measured at 25% extension is a maximum stress value in the extension-restoration test, and
in cases where measurements are started at the point where the extension process is complete in the stress relaxation properties test described below, the tensile force($F_{B0}$) immediately after completion of the extension process and the tensile force ($F_B(t30)$) 30 minutes after completion of the extension process satisfy the following formula:
$0.1 \leq F_B(t30)/F_{B0} \leq 0.7$
wherein a stress relaxation properties test is as follows:
a piece of resin composition having a thickness of 50 μm, a sample shape of a No. 6 dumbbell having a width of measured portion of 4 mm and a length of linear portion of 25 mm being subjected to an extension process under the conditions described below using a tensile-compression tester in accordance with ISO 3384, and at the point where the extension is complete, the tensile force being measured and defined as the initial tensile force ($F_{B0}$), and 30 minutes thereafter, the tensile force ($F_B(t30)$) being measured,
wherein extension process conditions are as follows:
deflection correction being carried out at a force of 0.05 N or lower to eliminate deflection generated when the test piece is attached to a clamp,
speed of testing of 25 mm/min to a 50% extension;
temperature conditions: 23° C., and
extension/holding conditions: holding for 30 minutes at 50% extension.

5. The resin composition according to claim 2, wherein even when the tests are repeated two or more times, the resin composition behaves in such a way that the following formulae are satisfied.

$$20\% \leq R \leq 95\%$$

$$0\% \leq \alpha \leq 3\%, \text{ and}$$

$$R = \frac{F_{AO} - F_A(t5)}{F_{AO}} \times 100.$$

6. A film prepared by using the resin composition according to claim 1.

7. The resin composition according to claim 1,
wherein the polyrotaxane is an axial molecule having terminal functional groups, and the polyrotaxane is enclathrated by a cyclic molecule, and
wherein the cyclic molecule is a ringshaped molecule able to be penetrated by a polymer molecule, and the cyclic molecule has one reactive group able to react with a crosslinking agent.

8. The resin composition according to claim 1, which further contains a crosslinking agent.

9. The resin composition according to claim 8,
wherein the crosslinking agent is at least one selected from the group consisting of an isocyanate, cyanuric chloride, trimesoyl chloride, terephthaloyl chloride, epichlorohydrin, dibromobenzene, glutaraldehyde, phenylene diisocyanate, tolylene diisocyanate, divinylsulfone, 1,1-carbonyldiimidazole, and an alkoxysilane.

* * * * *